US009813033B2

United States Patent
Testi et al.

(10) Patent No.: US 9,813,033 B2
(45) Date of Patent: Nov. 7, 2017

(54) SYSTEM AND METHOD FOR INDUCTOR ISOLATION

(71) Applicant: Innophase Inc., Chicago, IL (US)

(72) Inventors: Nicolo Testi, Chicago, IL (US); Yang Xu, Chicago, IL (US)

(73) Assignee: Innophase Inc., San Diego, CA (US)

(*) Notice: Subject to any disclaimer, the term of this patent is extended or adjusted under 35 U.S.C. 154(b) by 41 days.

(21) Appl. No.: 14/846,399

(22) Filed: Sep. 4, 2015

(65) Prior Publication Data

US 2016/0072442 A1 Mar. 10, 2016

Related U.S. Application Data

(60) Provisional application No. 62/046,710, filed on Sep. 5, 2014.

(51) Int. Cl.
*H03F 3/191* (2006.01)
*H03F 3/193* (2006.01)
*H03F 1/02* (2006.01)
*H03F 3/195* (2006.01)
*H03F 3/45* (2006.01)

(52) U.S. Cl.
CPC ............ *H03F 3/193* (2013.01); *H03F 1/0261* (2013.01); *H03F 3/195* (2013.01); *H03F 3/45183* (2013.01); *H03F 3/45188* (2013.01); *H03F 3/45475* (2013.01); *H03F 3/191* (2013.01); *H03F 2200/294* (2013.01); *H03F 2200/408* (2013.01); *H03F 2200/451* (2013.01); *H03F 2203/45138* (2013.01); *H03F 2203/45246* (2013.01)

(58) Field of Classification Search
CPC ........ H03F 3/193; H03F 1/0261; H03F 3/195; H03F 3/45183; H03F 3/45188; H03F 3/45475; H03F 3/45; H03F 2200/177; H03F 3/191; H03F 2200/546; H03F 2200/372; H03G 3/00; H03G 1/0035
USPC .................................................. 330/254, 305
See application file for complete search history.

(56) References Cited

U.S. PATENT DOCUMENTS

| | | | |
|---|---|---|---|
| 6,369,659 B1 | 4/2002 | Delzer | |
| 6,556,636 B1 | 4/2003 | Takagi | |
| 6,975,165 B2 | 12/2005 | LopezVillegas | |
| 7,095,274 B2 | 8/2006 | LopezVillegas | |
| 7,400,203 B2* | 7/2008 | Ojo | H03F 1/42 330/305 |
| 7,564,929 B2 | 7/2009 | LopezVillegas | |
| 8,368,477 B2* | 2/2013 | Moon | H03F 3/45188 327/156 |
| 8,498,601 B2 | 7/2013 | Horng | |
| 8,941,441 B2* | 1/2015 | Testi | H03G 3/008 330/254 |
| 2008/0079497 A1* | 4/2008 | Fang | H03F 1/223 330/302 |

(Continued)

OTHER PUBLICATIONS

Chi-Tsan Chen et al., Wireless Polar Receiver Using Two Injection-Locked Oscillator Stages for Green Radios, IEEE MTT-S International, Jun. 2011.

(Continued)

*Primary Examiner* — Khanh V Nguyen
(74) *Attorney, Agent, or Firm* — Invention Mine LLC

(57) ABSTRACT

An inductor isolation apparatus and method to reduce interaction between inductors on an integrated circuit.

20 Claims, 20 Drawing Sheets

(56) References Cited

U.S. PATENT DOCUMENTS

| | | | |
|---|---|---|---|
| 2009/0153244 A1* | 6/2009 | Cabanillas | H03F 1/3205 330/253 |
| 2009/0195310 A1* | 8/2009 | Holenstein | H03F 1/3205 330/254 |
| 2011/0050296 A1 | 3/2011 | Fagg | |
| 2012/0306547 A1 | 12/2012 | Arora | |
| 2016/0155558 A1* | 6/2016 | Groves | H01F 17/0013 336/200 |

OTHER PUBLICATIONS

International Search Report and Written Opinion for PCT/US2014/030525 dated Jul. 24, 2014.

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, pp. 3757-3766.

International Search Report for PCT/US2013/024159 dated Apr. 9, 2013.

Chi-Tsan Chen, Cognitive Polar Receiver Using Two Injection-Locked Oscillator Stages, IEEE Transactions on Microwave Theory and Techniques, vol. 59, No. 12, Dec. 2011.

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference.

Hamid R. Rategh, et al., Superharmonic Injection Locked Oscillators as Low Power Frequency Dividers, Stanford University, Stanford, California.

Behzad Razavi, A Study of Injection Pulling and Locking in Oscillators, Electrical Engineering Department, University of California, 2003, IEEE, Custom Integrated Circuits Conference.

Marc Tiebout, A 50GHz Direct Injection Locked Oscillator Topology as Low Power Frequency Divider in 0.13 μm CMOS, Infineon Technologies AG, Solid-State Circuits Conference, 2003, pp. 73-76, 29th European ESSCIRC.

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan.

* cited by examiner

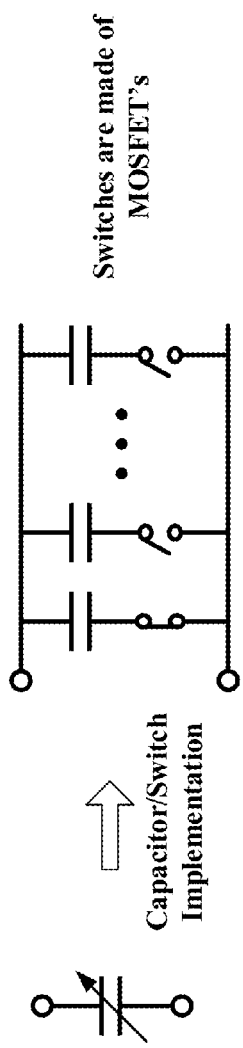
FIG. 7 Capacitor/Switch Implementation — Switches are made of MOSFET's
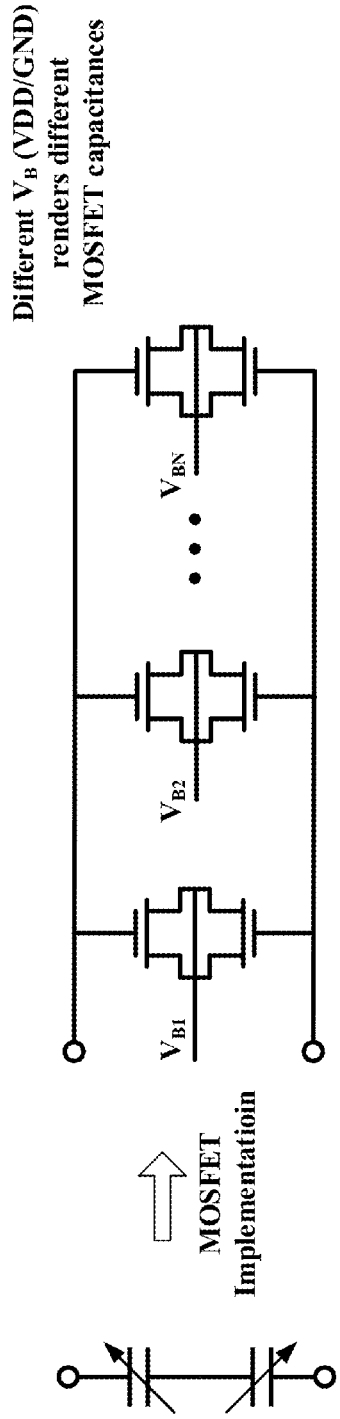
FIG. 8 MOSFET Implementation — Different $V_B$ (VDD/GND) renders different MOSFET capacitances
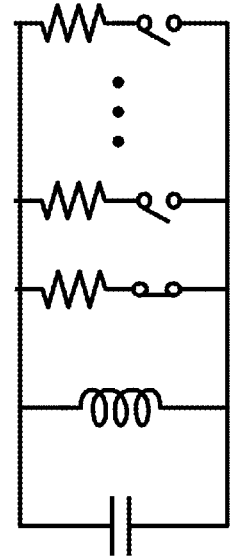
FIG. 9 Resistor/Switch Implementation
$Q = w_0 CR$
$Q = R/(w_0 L)$

| Type | [1] | [2] | [3] | [4] | [5] | This work |
|---|---|---|---|---|---|---|
| Technology | $g_m$-C | Q-enhanced | Q-enhanced | SOI | Q-enhanced | Q-enhanced |
| | 65nm | 65nm | 0.18μm | | 0.25μm | 55nm |
| Filter Order | 4 | 2 | 4 | 2 | 4 | 4 |
| Gain (dB) | 3.5 | 35 | 3.5 | 32 | -2 | -10 ~ 62 |
| Frequency Range (MHz) | 300 ~ 1200 | 2395 ~ 2735 | 5120 ~ 5345 | 2450 ~ 2850 | 1770 ~ 1960 | 2350 ~ 2475 |
| BW (MHz) | 21 | 16 | 200 | 27 | 150 | 12 |
| Single Stage Q | N/A | 150 | 68 | 100 | N/A | 400 |
| NF (dB) | 9.5 | 6 | N/A | 7 | N/A | 9 |
| P1dB out (dBm) | -4.4 | N/A | N/A | 7 | -9.5 | -4 |
| DR (dB) | 83 | N/A | N/A | 68 | 63 | 100 ~ 28 |
| Supply Voltage (V) | 2.5 | 0.6 | 1.8 | 3 | 3 | 1.3 |
| Power (mW) | 17.6 | 1.066 | 40.7 | 15 | 54 | 7.8 |
| FoM * (dB) | 144.1 | N/A | N/A | 130.2 | 127.5 | 162.1 ~ 90.1 |
| FoM_Q ** (dB) | 161.7 | N/A | N/A | 150.4 | 138.7 | 185.2 ~ 113.2 |

\* FoM = DR*BW/Power = P1dBout (dBm) − Gain (dB) + 174 (dBm) − NF (dB) − 10log(Power (mW))   [4]

\** FoM_Q = DR*BW*Q/Power = FoM1 + 10log(fc/BW)

FIG. 20

SYSTEM AND METHOD FOR INDUCTOR ISOLATION

CROSS REFERENCE TO RELATED APPLICATIONS

This application claims the benefit of U.S. Provisional Application No. 62/046,710 filed Sep. 5, 2014, reference of which is hereby incorporated herein in its entirety.

BACKGROUND OF THE INVENTION

Tunable and highly selective RF filters are used in modern reconfigurable transceivers. On-chip band-pass filters (BPFs) become more attractive than typical off-chip SAW and BAW filters due to their flexibility. Nowadays there are two main approaches to implement on-chip active RF BPFs, namely gm-C BPF and Q-enhanced BPF. The former technique allows a good quality factor with wide tuning range. But the power consumption becomes prohibitive when linearity and maximum operational frequency requirements grow. LC Q-enhanced filters are suitable for GHz applications, and can achieve high quality factors with lower power consumption. However, they have limited application due to the tight trade-off between maximum usable tank Q (~150) and dynamic range (DR~85 dB).

BRIEF DESCRIPTION OF THE SEVERAL VIEWS OF THE DRAWINGS

The accompanying FIG.s, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIGS. 7 and 8 are implementations of capacitor banks in accordance with some embodiments.

FIG. 9 is an implementation of a resistor bank in accordance with some embodiments.

FIG. 20 is a summary result table in accordance with some embodiments.

Figure 1:
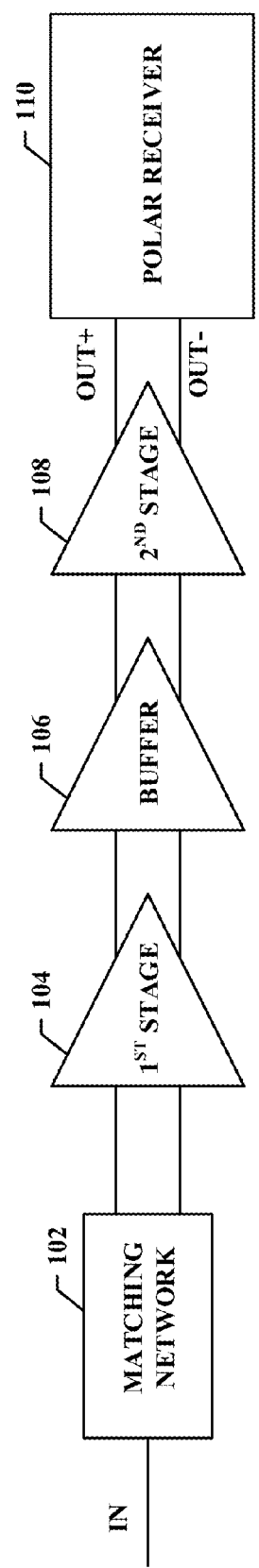
FIG. 1 is a block diagram of a LNA architecture in accordance with some embodiments.

Skilled artisans will appreciate that elements in the FIG.s are illustrated for simplicity and clarity and have not necessarily been drawn to scale. For example, the dimensions of some of the elements in the FIG.s may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein is a system and method for inductor isolation. The disclosed system and method is discussed in the context of a low-noise amplifier (LNA) which is sometimes referred to as a bandpass filter (BPF) as it performs frequency filtering. In many of the various embodiments the LNA/BPF includes a plurality of frequency selection circuits which themselves include a respective inductive elements (inductor). A metallization wall surrounds each of the respective inductive elements so as to mitigate feedback and improve isolation between stages of the LNA/BPF. A given metallization wall may surround only the respective inductive element, the entire stage of the LNA/BPF, or a subset of the elements in the LNA/BPS stage that includes the respective inductive element. A single metallization wall does not encompass the respective inductive elements of different stages.

Figure 6:
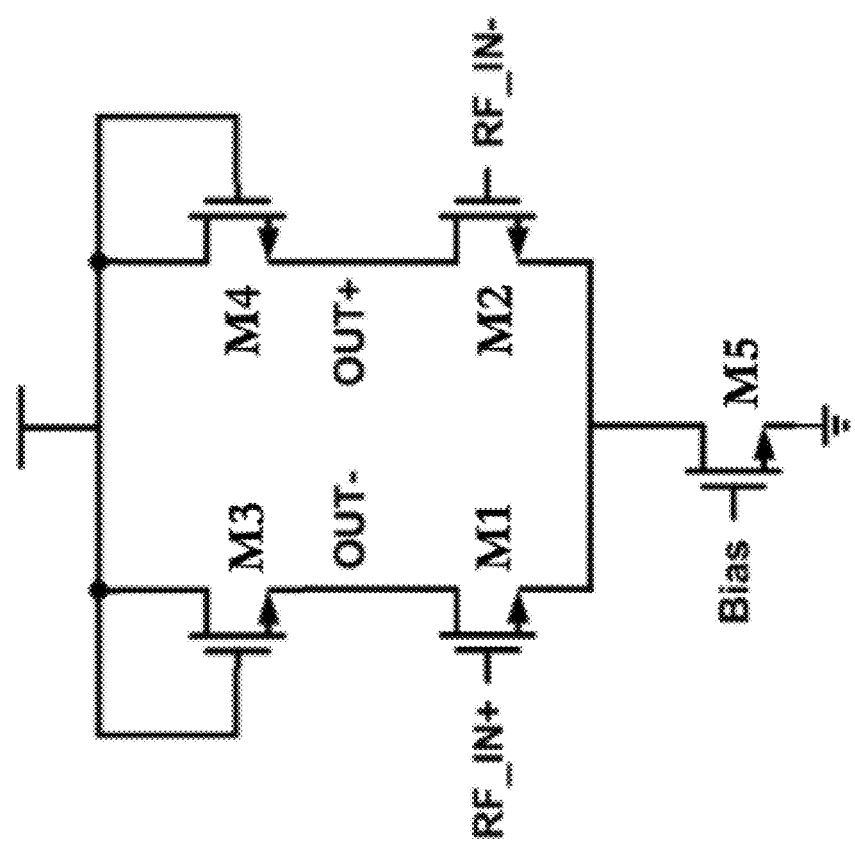
FIG. 6 is a circuit diagram of a buffer in accordance with some embodiments.

With reference to FIG. 1, an embodiment of a low noise amplifier in accordance with some embodiments will be described. A received signal, such as from an antenna, is received by the matching network 102. The output of the matching network is provided to the first LNA stage 104, the output of which is connected via buffer 106 to the second LNA stage 108. The buffer circuit is depicted in FIG. 6.

The output of the cascaded LNA stages is further processed in a receiver, such as a polar receiver 110. Additional details of the polar receiver may be found in the co-pending application Ser. No. 13/840,478 filed Mar. 15, 2013, entitled POLAR RECEIVER SIGNAL PROCESSING AND ARCHITECTURE. Other well-known receiver architectures may also be used. Each stage of the two LNA stages 104, 108 may be tuned to exhibit a bandpass response and therefore may be referred to as a bandpass filter throughout the balance of this disclosure. The two center frequencies, one from each stage, may be offset to provide an overall wider frequency bandwidth, yet still providing a high degree of off-band selectivity so as to reject adjacent channels.

Figure 2:
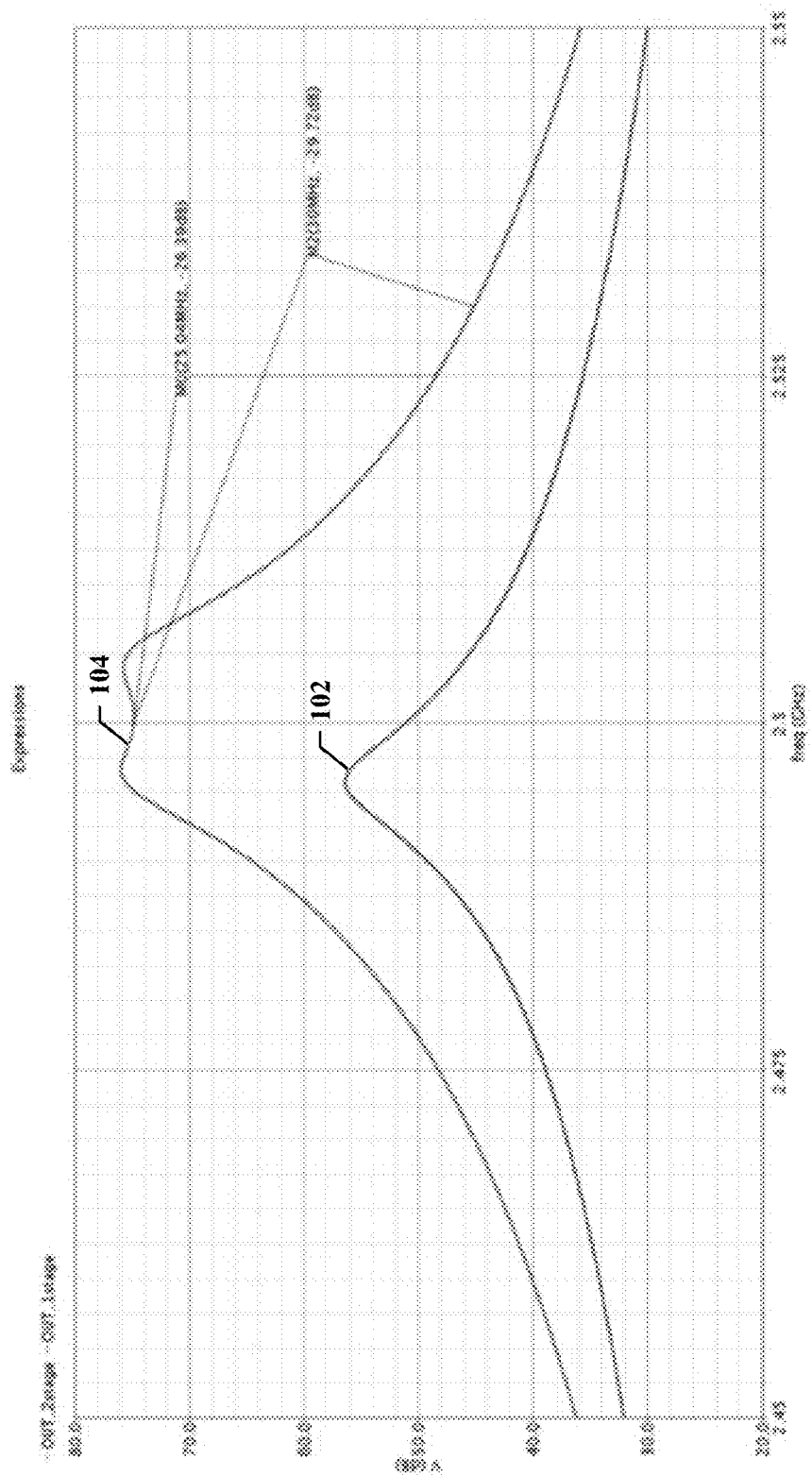
FIG. 2 is a plot of the frequency response of LNAs in accordance with some embodiments.

With reference to FIG. 2, the frequency response of the first stage is shown in plot 102, while the aggregated response of the frequency-staggered stages is shown in plot 104.

Figure 3:
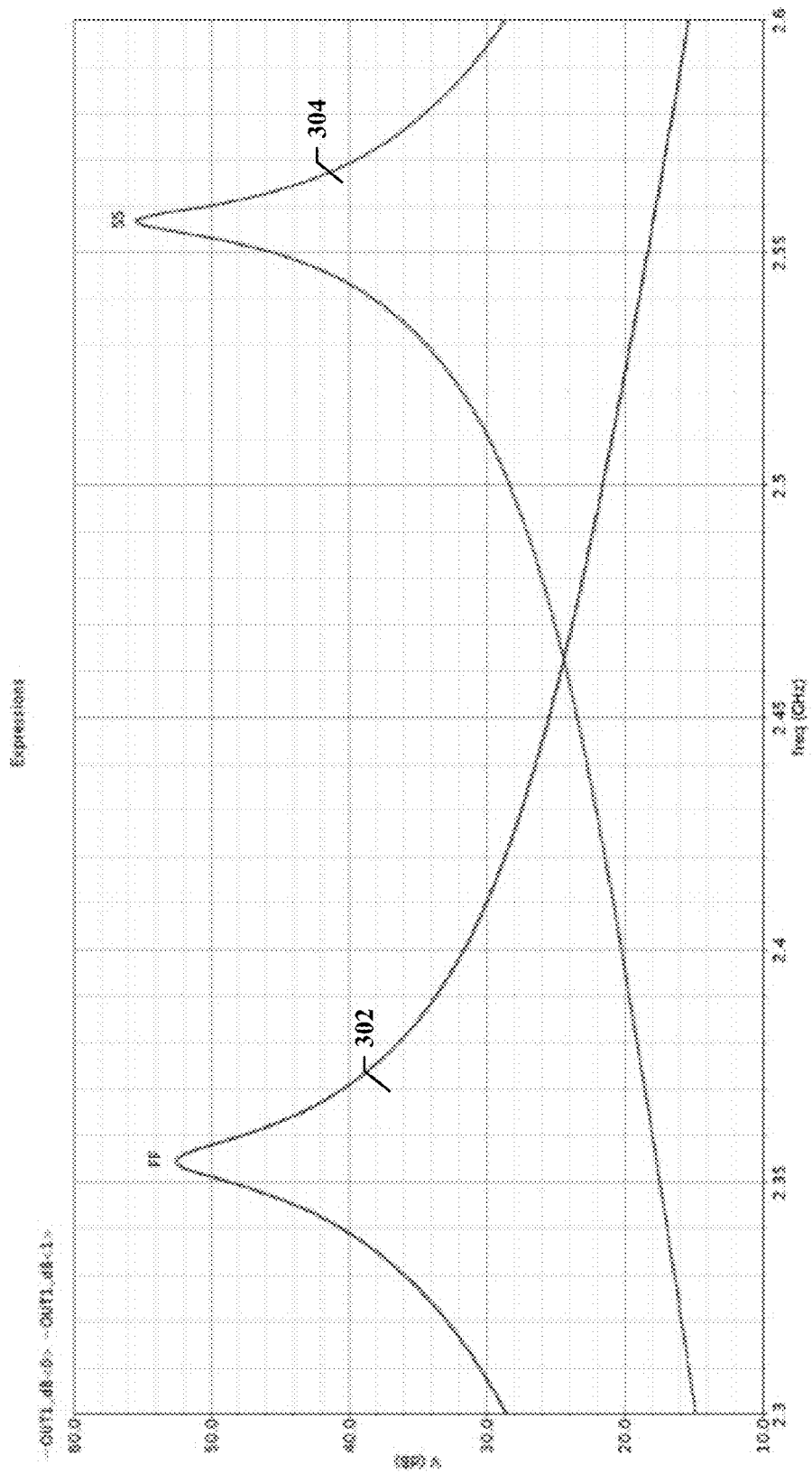
FIG. 3 is a block diagram of a configurable LNA frequency tuning in accordance with some embodiments.

With reference to FIG. 3, plots 302 and 304 both represent the response of the first stage. FIG. 3 shows that the center frequency of the filter may be tuned across the desired frequency band in the worst process corners.

Figure 4:
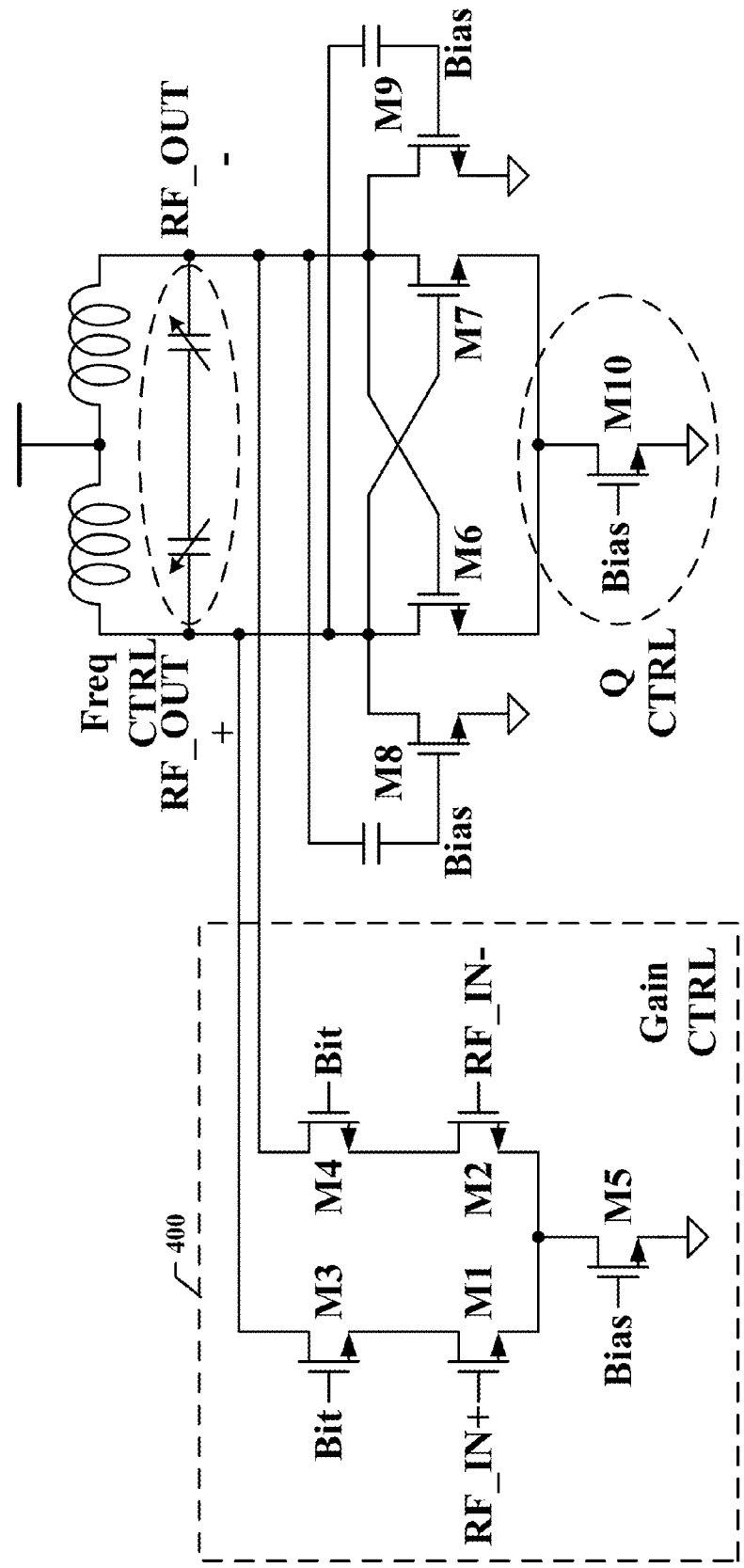
FIG. 4 is a circuit diagram of one embodiment of an adjustable LNA stage in accordance with some embodiments.

With reference to FIG. 4, the tunable LNA stage is depicted. The variable gain stage including the differential pair M1, M2, and the control FETs M3, M4 controlled by a Bit signal from the controller, is configured to provide a variable transconductance gain to drive the bandpass filter load. The LNA stage may include a plurality of switchable transconductance cells such as those shown in FIG. 5. The controller may use a binary code to adjust the gain, wherein each cell provides twice the gain of the prior cell. In addition, or as an alternative, some or all of the gain stage cells may provide equal amounts of gain, and may be controlled by a thermometer code control signal.

Again with respect to FIG. 4, the bandpass filter acting as the load for the transconductance gain stage includes an adjustable, or tunable tank circuit with frequency control (Freq CTRL). The tank circuit may be an LC tank as shown, or may alternatively be an RC tank circuit. The adjustable capacitors may take the form of a capacitor bank, such as that depicted in FIGS. 7 and 8. Each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank.

The bandpass filter also include cross-coupled transistors M6, M7 to complete the bandpass load. Note the cross-coupled compensation transistor pair M8, M9. These cross-coupled compensation transistors are biased in a sub-threshold region.

In small signal analysis the two currents flowing into M6 (I1) and M8 (I2) can be written as:

$$I1 = gm_{M6,1} \cdot V_{RFOUT-} + gm_{M6,2} \cdot V_{RFOUT-}^2 + gm_{M6,3} \cdot V_{RFOUT-}^3,$$

$$I2 = gm_{M8,1} \cdot V_{RFOUT-} + gm_{M8,2} \cdot V_{RFOUT-}^2 + gm_{M8,3} \cdot V_{RFOUT-}^3.$$

Where $gm_{M6,1}$, $gm_{M6,2}$, $gm_{M6,3}$, $gm_{M8,1}$, $gm_{M8,2}$ and $gm_{M8,3}$ are respectively the first, second and third terms in the Taylor expansion of the current for transistors M6 and M8. The first order term corresponds to the regular small signal gm. For a transistor biased in saturation, the third order term is negative. So if the amplitude of the input signal increases, the current starts to compress. On the contrary, for a transistor biased in the sub-threshold region, the third order term is positive. So if the amplitude of the input signal increases, the current increases accordingly. In FIGS. 4 M6 and M7 are biased in saturation, while M8 and M9 are in sub-threshold. So it is possible to have $gm_{M6,3} = -gm_{M8,3}$ using the proper transistor sizing and bias. In this way the total current in each branch results:

$$I_{tot} = I1 + I2 = (gm_{M6,1} + gm_{M8,1}) \cdot V_{in} + (gm_{M6,2} + gm_{M8,2}) \cdot V_{in}^2.$$

Because the signals applied to the two branches are differential, the second order term $(gm_{M6,2} + gm_{M8,2}) \cdot V_{in}^2$ is canceled. In this way, the linear range of the cross-coupled transistor pair M6, M7 is extended by the cross-coupled compensation pair M8, M9.

The quality factor Q of the bandpass load may also be adjusted. In one embodiment, the bias on transistor M10 is adjusted. A very high Q may be used, even as high as 400 or 500, while still maintaining a linearized response from the bandpass load at high output swing (100 mVp). The high-Q tank, or bandpass load, presents a large resistance to the transconductance gain stage, which will therefore produce a large gain from a small current signal. Note also that the high Q provides narrow band selection and high rejection of adjacent bands or channels. The Q may also be reduced by selectively inserting resistances in the tank circuit under the control of the LNA control circuit. Such a resistor bank may be realized as depicted in FIG. 9.

Because the high quality factor Q becomes extremely sensitive to the value of transconductance of the cross-coupled pair, $-g_m/2$, small variations of $g_m$ may result in a large variation of Q. Thus, linearizing the transconductance of M6 and M7 with the insertion of the sub-threshold biased cross-coupled compensation transistor pair greatly increases the dynamic range of the LNA stages. Without this compensation, a decrease in the Q factor due to large output swing will reduce the gain and increase the response bandwidth, and result in less adjacent channel rejection.

Note also that while the addition of the cross-coupled compensation transistor pair may generate some additional noise, the compensation pair is part of the load, and any additional noise is relatively insignificant because it is not passing through the amplification stage. That is, the noise is injected at the output of the amplifier rather than the input, and thus has a minor impact, especially in a very high gain LNA.

Figure 10:
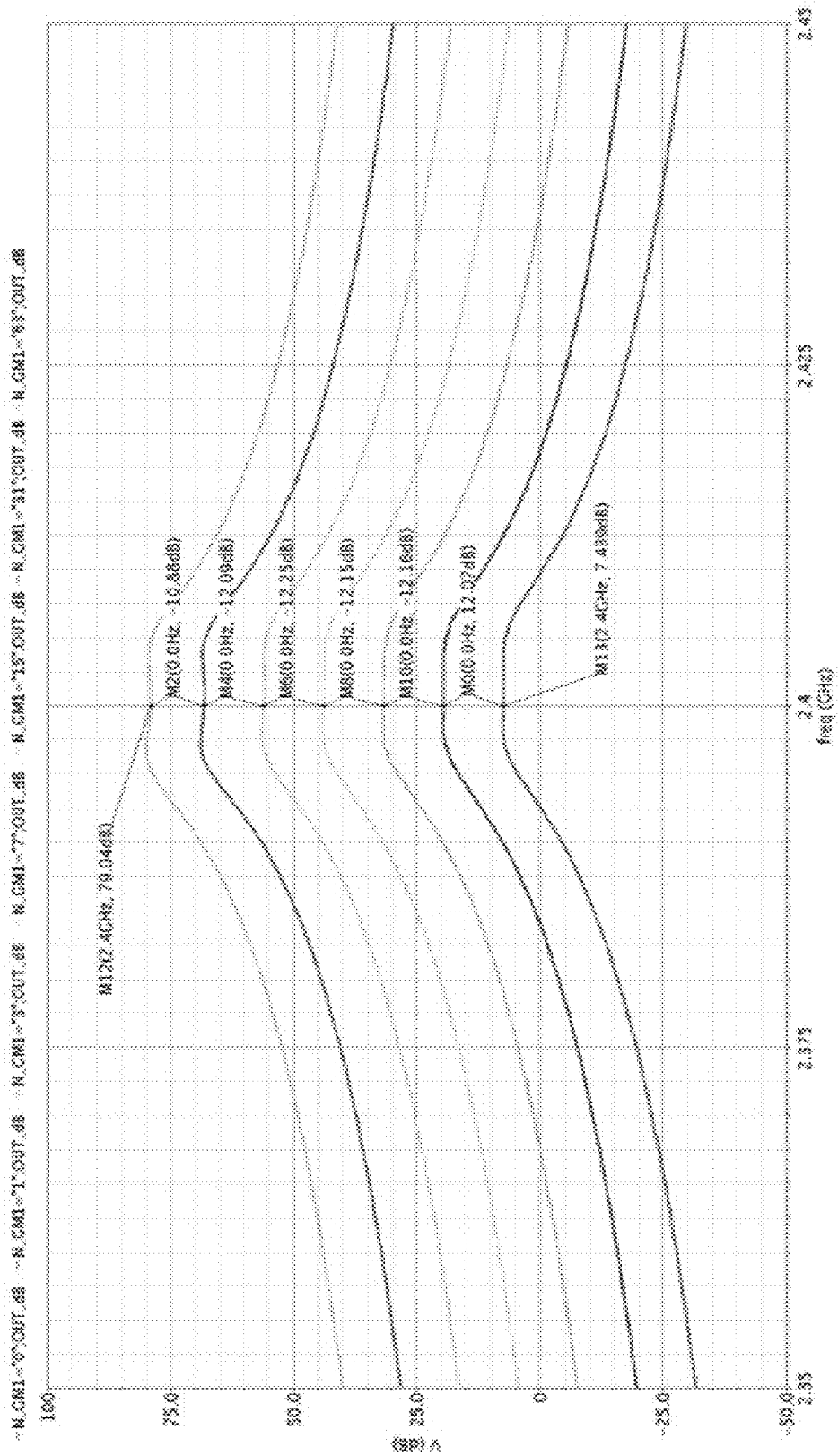
FIG. 10 is a plot of variable gain values in accordance with some embodiments.
Figure 11:
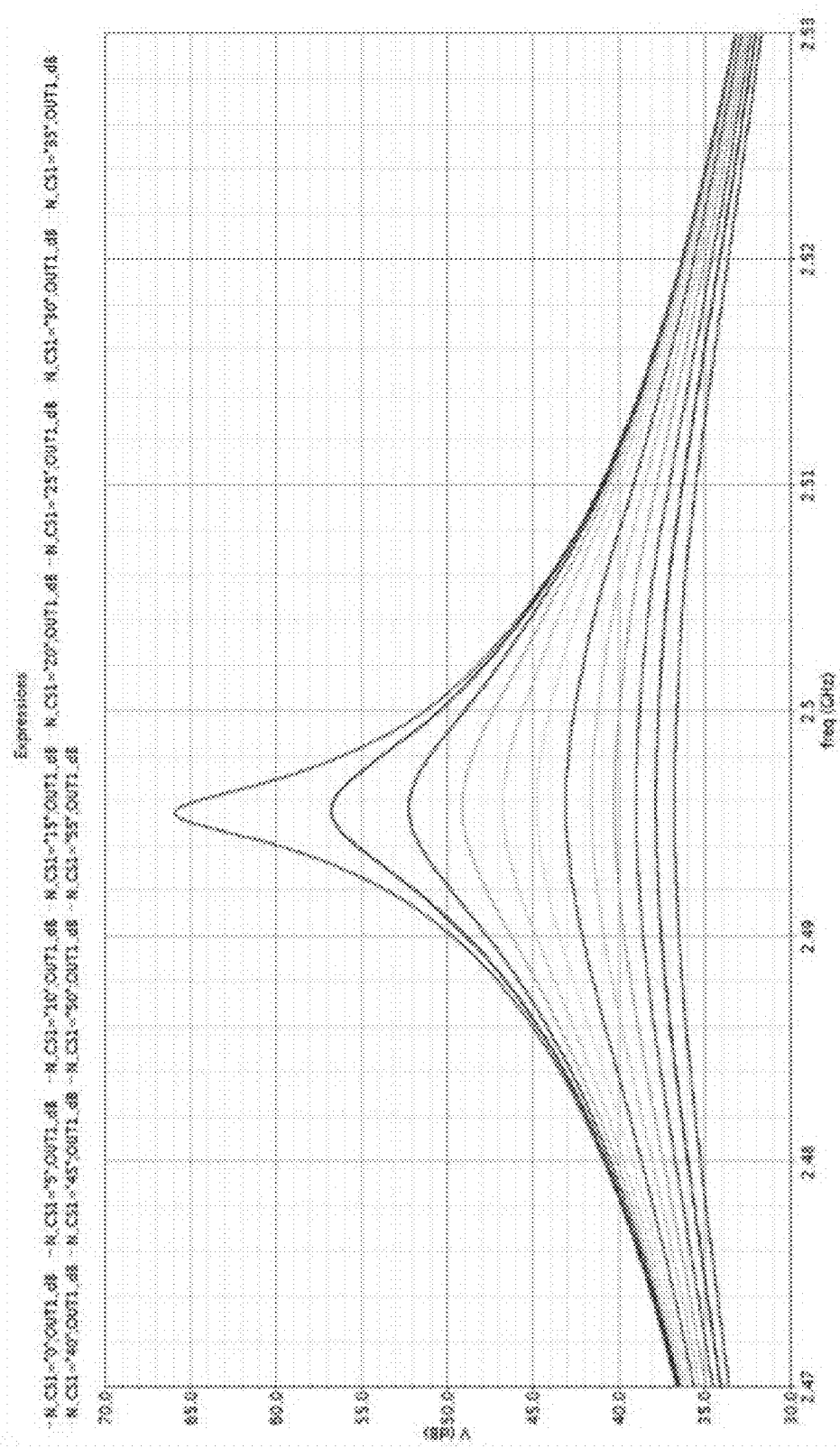
FIG. 11 is a signal plot showing Q values in accordance with some embodiments.
Figure 12:
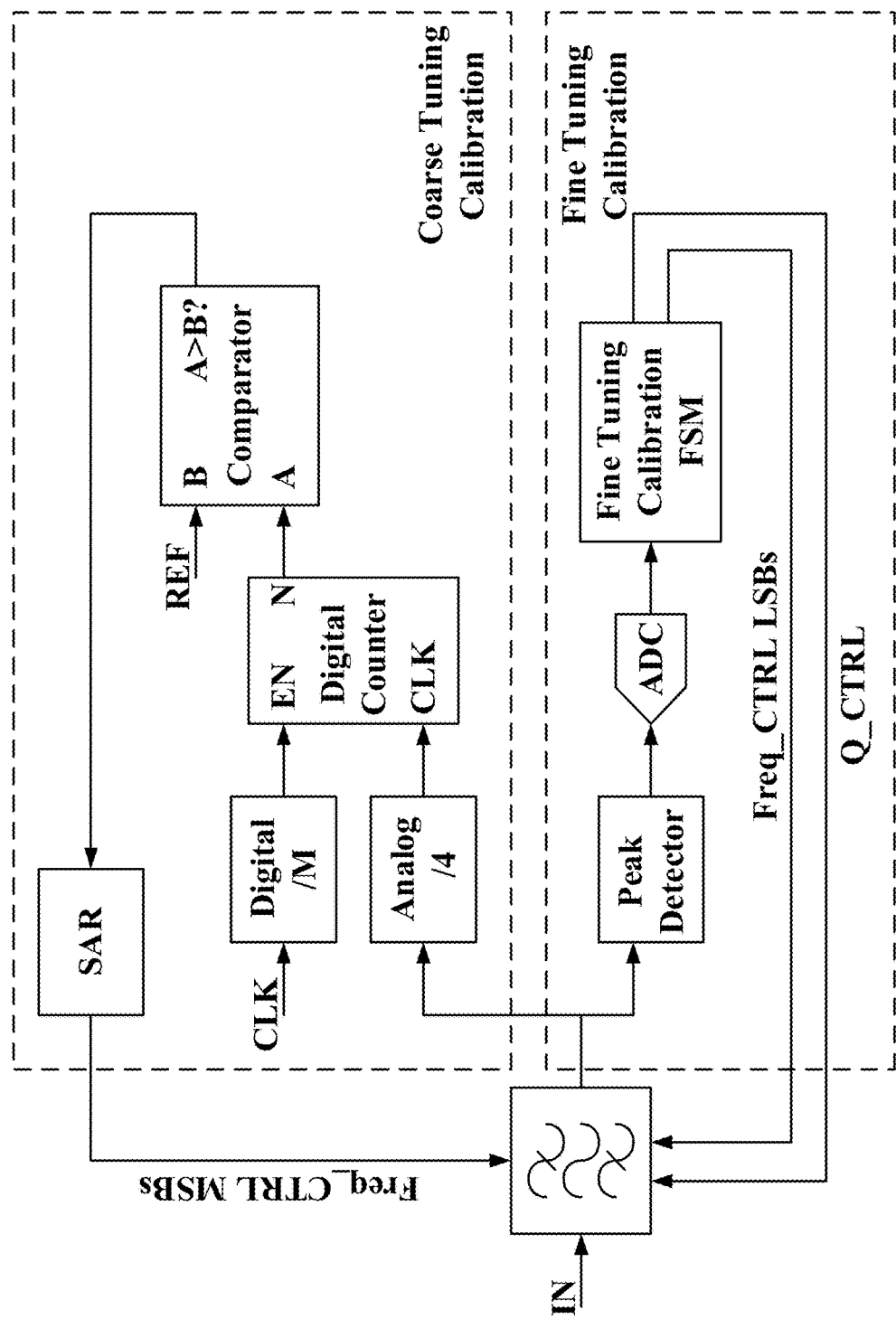
FIG. 12 is a control circuit configured to control the LNAs in accordance with some embodiments.

With reference to FIG. 10, some of the gain tuning steps are depicted. With reference to FIG. 11, some of the Q tuning steps are shown. One apparatus and method of controlling and/or calibrating the LNA stages is depicted in FIG. 12 in accordance with some embodiments.

The LNA controller 1200 may include a finite state machine to control the circuits and/or modules of the controller. The LNA may be driven to oscillation during one or more steps of the calibration. A frequency detector may comprise a digital divide by M to divide a clock signal, and an analog divide by 4 (or other number) circuit to reduce the frequency of the monitored oscillations from the LNA bandpass load in the form of an LC tank.

The LNA controller may be configured to provide a control output signal on the frequency control output line corresponding to the most significant bits from the coarse tuning circuit, and corresponding to the least significant bits from the fine tuning control circuit. These bits may be used to switch a capacitor bank to alter the resonant frequency of the bandpass load. In the coarse tuning mode, the Q of the LNA may be increased to point of causing the LNA to oscillate. The frequency at which the LNA resonates is related to the peak of the frequency response when not in oscillation. Thus, the oscillatory condition induced in the LNA may be used to coarsely adjust the tank circuit capacitance. In the fine tuning mode, the controller generates one or more tones and measures the amplitudes to determine both a 3 dB point (which measures the Q) as well as the frequency at which a peak output may be obtained, which corresponds to the center frequency of the bandpass filter.

Other tones and measurements may also be used to determine a fine calibration of the LNA.

The control output may include multiple parallel bits for controlling the Q factor of the LNA stages. The LNA controller may responsively adjust the Q by altering a bias current in the bandpass load circuit.

Figure 5:
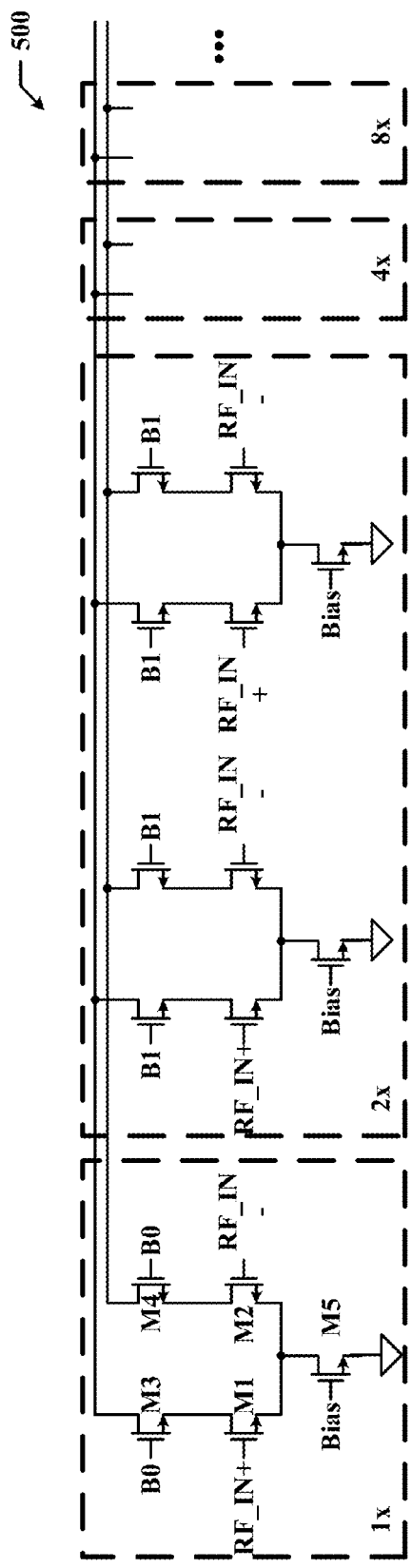
FIG. 5 is an implementation of cells used to provide digitally controlled variable gain in accordance with some embodiments.

With reference to LNA variable gain transconductance stage 400, the variable gain may be achieved by switching either ON or OFF additional transistor devices. One such variable transconductance stage is shown in FIG. 5. The gain control signal from the LNA controller may include numerous bits B0, B1, B2 etc. Control bit B0 may be used to control a first cell, control bit B1 may be used to control a second cell, and control bit B2 may be used to control a third cell. Note that the first, second and third cells each provide an increasing amount of transconductance amplification. The code may be referred to as a binary code in that each bit controls an amplification of twice the prior stage. In an alternative embodiment, each cell may add the same amount of gain, in which case the binary control word may be referred to as a thermometer code.

In one embodiment, the apparatus comprises a variable gain amplifier stage configured to accept an input signal and to provide a load driving signal, a tunable bandpass filter connected as a load to the variable gain amplifier stage, and a controller circuit configured to tune the bandpass filter. The bandpass filter includes a resonant tank, a cross-coupled transistor pair, and at least one cross-coupled compensation transistor pair biased in a subthreshold region. That compensation configuration adds a transconductance component when the load driving signal is of a magnitude large enough to decrease the transconductance of the cross-coupled transistor pair. Further, it may include a controller circuit configured to tune the bandpass filter. The bandpass filter may comprise a capacitor bank, and the controller circuit may be configured to adjust the capacitor bank to alter the center frequency of the bandpass filter. The controller circuit may be configured to alter a bias point of the cross-coupled transistors to vary the Q of the tank, to induce an oscillation in the bandpass filter, to measure the resonant frequency of the oscillation, and to adjust the resonant frequency of the bandpass filter. The variable gain stage amplifier may be a transconductance amplifier stage that has a plurality of parallel connected transconductance cells. In addition, the at least one cross-coupled compensation transistor pair may comprise a plurality of parallel-connected cross-coupled compensation transistor pairs. Each of the plurality of parallel-connected cross-coupled compensation transistor pairs may be biased at a different sub-threshold voltage. In an embodiment, a bias control circuit may be configured to adjust a sub-threshold bias voltage of the at least one cross-coupled compensation transistor pair. The control circuit may also be configured to adjust a quality factor Q of the first and second bandpass filters to obtain a desired adjacent channel rejection ratio.

Figure 13:
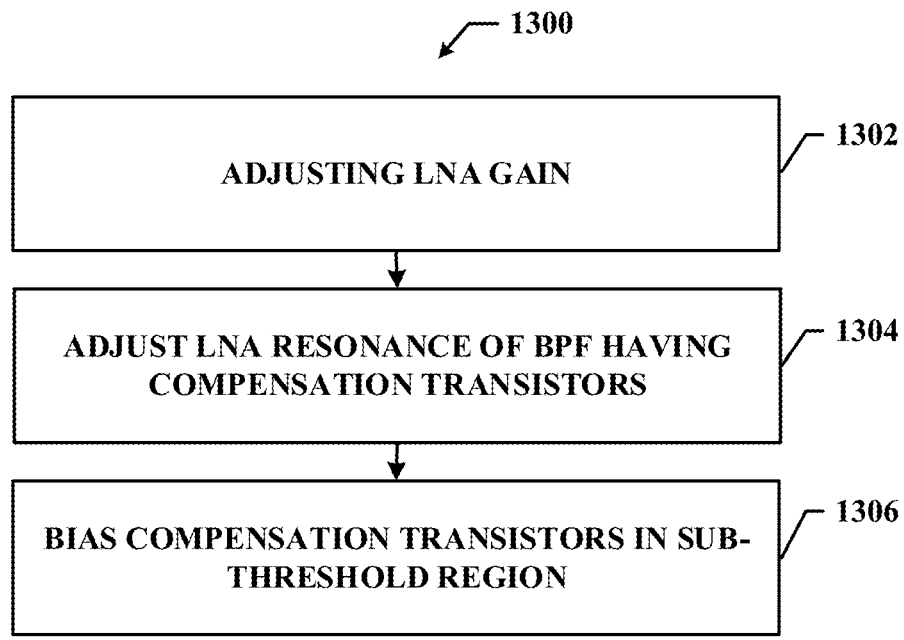
FIGS. 13 and 14 are flow charts depicting a method of LNA adjustment in accordance with some embodiments.

With reference to FIG. 13, a method will be described in accordance with some embodiments. A method 1300 may comprise: adjusting 1302 the gain of a variable gain amplifier stage; adjusting 1304 a resonant frequency and a Q of a tunable bandpass filter connected as a load to the variable gain amplifier stage; wherein the bandpass filter includes a cross-coupled transistor pair, and at least one cross-coupled compensation transistor pair; and 1306 biasing the at least one cross-coupled compensation transistor pair in subthreshold region. Note that the steps described do not require a specific sequence. In particular, as an example, the order may be reversed. A compensation may first be adjusted, then the resonant or center frequency and Q, and finally the gain. The method may include adjusting the resonant frequency of a tunable bandpass filter by adjusting a capacitor bank. In an embodiment, the method may further comprise adjusting a bias point of the cross-coupled transistors to induce an oscillation in the bandpass filter or resonant tank; measuring the resonant frequency of the oscillation; and, adjusting the resonant frequency of the bandpass filter. In an embodiment, the method may comprise adjusting a bias point of the cross-coupled transistors to tune the Q of the resonant tank. The method may include adjusting the gain of the variable gain stage amplifier by switching on or off a plurality of parallel connected transconductance cells. The at least one cross-coupled compensation transistor pair may comprise a plurality of parallel-connected cross-coupled compensation transistor pairs, and the method may further comprise setting the bias voltage at a different subthreshold voltage for each of the plurality of parallel-connected cross-coupled compensation transistor pairs. The method may also comprise adjusting a sub-threshold bias voltage of the at least one cross-coupled compensation transistor pair.

Figure 14:
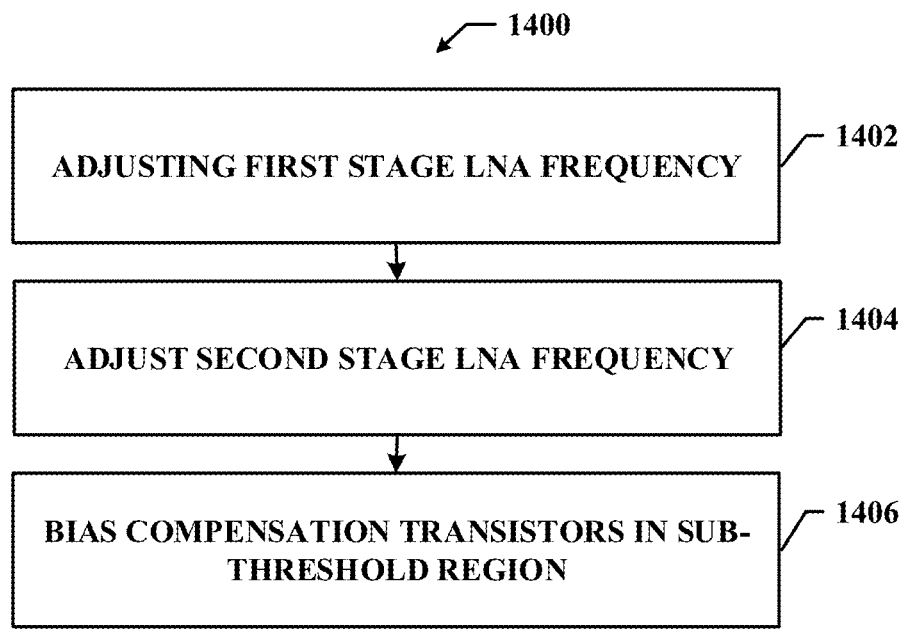

An additional method 1400 of FIG. 14 may comprise adjusting 1402, to a first frequency, a resonant frequency of a first low noise amplifier stage having a first variable gain amplifier stage and a first tunable bandpass filter; adjusting 1404, to a second frequency offset from the first frequency, a resonant frequency of a second low noise amplifier stage having a second variable gain amplifier stage and a second tunable bandpass filter; and, biasing 1406 cross-coupled compensation transistor pairs in each of the first tunable bandpass filter and second tunable bandpass filter in a sub-threshold region to provide a compensation transconductance in the presence of large signals. Again, note that the order of steps presented is not limiting. The method 1400 may be performed by first biasing the compensation transistors. The frequency and Q of the LNA stages may then be adjusted. The first frequency and second frequency may be selected in accordance with a desired channel frequency. The quality factor Q of the first and second bandpass filters may be adjusted to obtain a desired adjacent channel rejection ratio. The adjusting steps of the first and second bandpass filter resonant frequencies may comprise adjusting a bias point of the cross-coupled transistors to induce an oscillation in the respective bandpass filter; measuring the resonant frequency of the oscillation; and, adjusting the resonant frequency of the respective bandpass filter.

As the LNA of FIG. 1 performs filtering it is valid to refer to it as a BPF. Each of the linearization stages operates as a bandpass filter stage and may be referred to as such. Further described herein, in the context of a 2.4-GHz 72 dB-Variable-Gain 100 dB-DR 7.8 mW, 4th-Order Tunable Q-Enhanced LC Band-Pass Filter, is a system and method of providing inductor isolation, as well as LNA linearization techniques, calibration techniques and other associated inventions.

In some embodiments, a trade-off between the limitations associated with gm-C BPF and Q-enhanced BPF is significantly relaxed by introducing an RF linearization technique to realize a high DR (100 dB) BPF with a tank Q of 400. The resulting filter is highly reconfigurable in gain, bandwidth and center frequency, with low power consumption.

Figure 15:
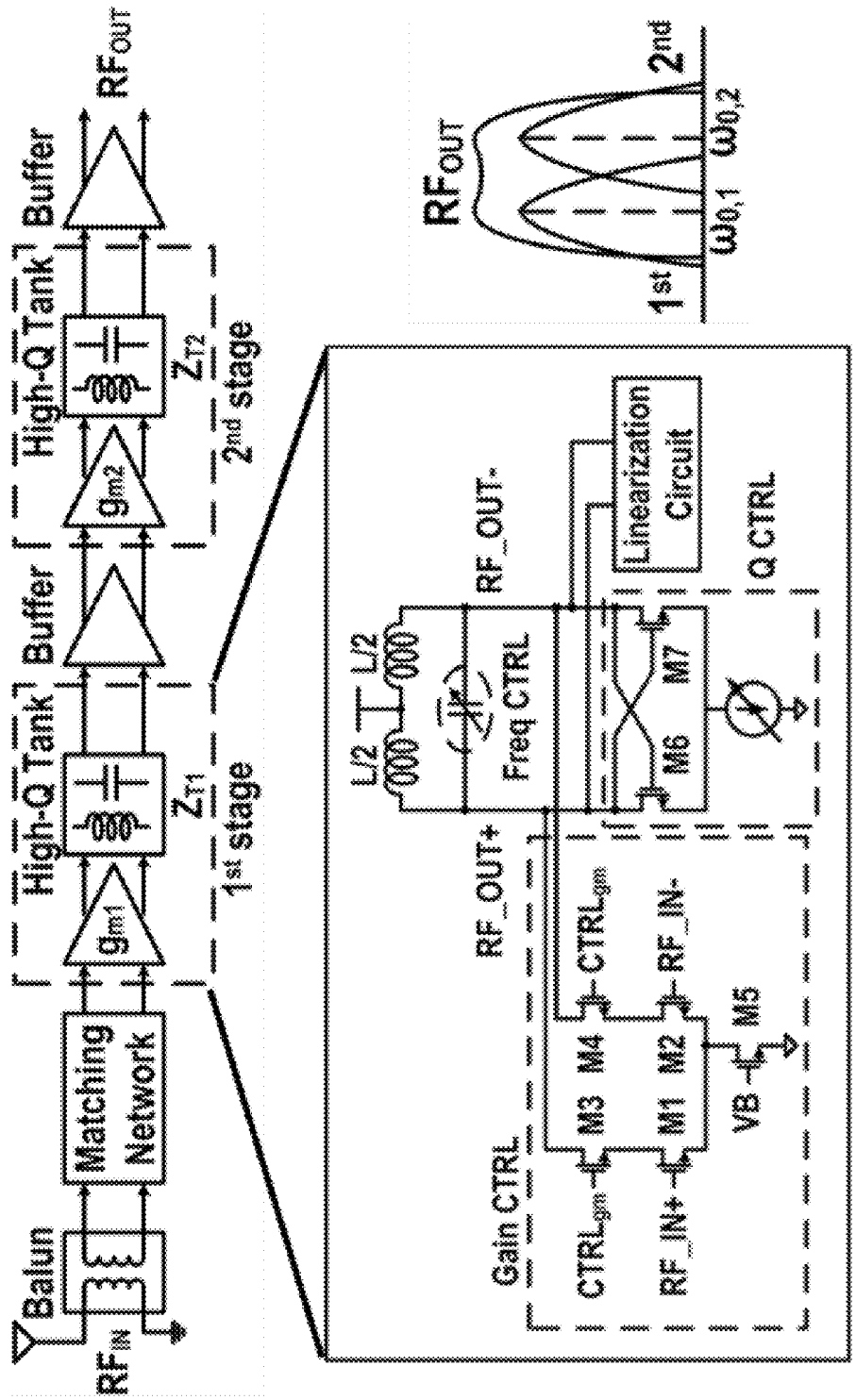
FIG. 15 is a block diagram of a dual-stage low noise amplifier in accordance with some embodiments.

FIG. 15 shows a detailed block diagram of the presented LNA architecture of FIG. 1 which, for the balance of this disclosure will be referred to as a BPF. The BPF includes two identical cascaded BPF stages. Each of them is formed by a transconductance followed by a tunable Q-enhanced LC tank. The two tanks are tuned separately at a desired Q and center frequency using a software-controlled 3-tones calibration process. Such a process is described in connection with FIG. 22. The implemented calibration process, together with monitoring circuits ensures a stable performance of the BPF across PVT variations. Center frequencies of each BPF stage are staggered to achieve an overall large bandwidth, without losing the out-of-band rejection of the high-Q. A buffer is inserted after each stage to improve inter-stage isolation. An example buffer circuit is depicted in FIG. 6.

A schematic of each BPF stage is shown in FIG. 15. The transconductance is implemented as an array of differential pairs connected in parallel and binary weighted (7 bits). The BPF stage may include a plurality of switchable transconductance cells such as those shown in FIG. 5. The gain of the filter can be set by turning ON or OFF the cascode transistors of each differential pair, providing overall 72 dB of gain range. The dimensions of the cascode transistors M3 and M4 are critical. They have to provide enough isolation to shield the drain of M1 and M2 from the impedance of the high-Q tank. Otherwise the input matching will be sensitive to the high-Q tank frequency response. In this design, cascode transistors with long length (l=240 nm) are used. A complementary transconductance array with grounded RF inputs is also connected to the tank. The pairs that are OFF in the main transconductance are ON in the complementary one, and vice versa. That is to ensure the high-Q tank maintains the same bias condition and frequency response for any gain setting. The center frequency of each filter is tuned by controlling a switched capacitor array, examples of which are depicted in FIGS. 7 and 8 in the form of capacitor banks, with a fine step of 0.4 MHz, while the Q of the tank is tuned by changing the value of the tail current of the cross-coupled devices (M6, M7). The negative conductance generated by the cross-coupled pair is directly proportional to the gm of those devices. Therefore, different levels of compensations of the LC tank loss can be achieved by modifying their bias point. The high flexibility of the presented BPF allows many filter configurations optimized for target applications. Different gain, bandwidth and out-of-band rejection can be achieved by tuning the two cascaded filters at different transconductance, center frequency and Q settings.

Importantly, the higher the Q is enhanced, the more the frequency response of the filter becomes sensitive to the variations of the tank conductance (Gind+Gmain). Therefore, the conductance non-linearity limit the maximum usable Q for a given DR and gain. This disclosure describes a RF linearization technique to compensate the degradation of the tank conductance due to large voltage swings, to achieve a higher usable Q together with a high DR.

Figure 16:
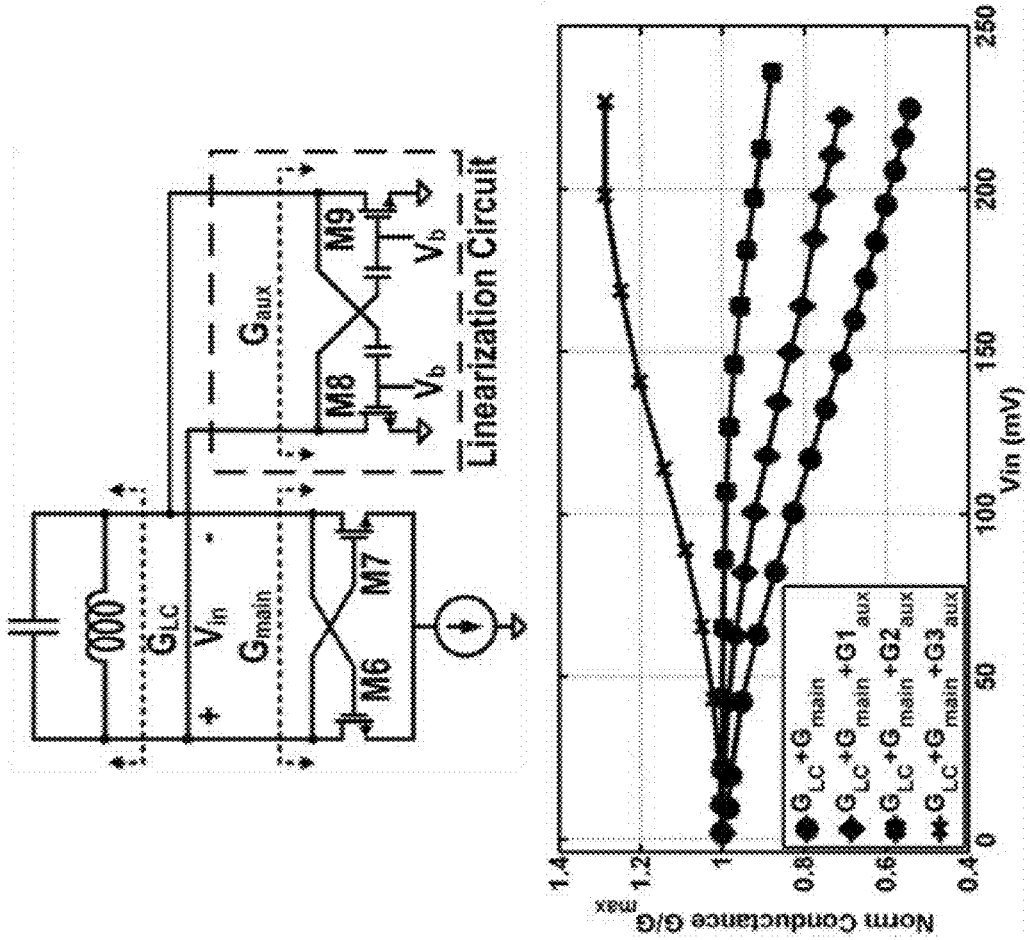
FIG. 16 is a schematic of a linearization circuit in accordance with some embodiments.

FIG. 16 shows a schematic of the linearization circuit that was previously depicted in FIG. 4. It consists of a pseudo-differential cross-coupled pair providing an auxiliary negative conductance (Gaux). M8 and M9 have to be biased in the sub-threshold region to provide third order non-linearity cancellation. Being in sub-threshold allows the dependency of Gaux over the voltage swing to have a profile that opposes Gind+Gmain. The linearization improvement provided by the auxiliary differential pair depends on the size and bias of M8 and M9. FIG. 16 shows the normalized conductance with and without the sub-threshold linearization circuit. Curves for different linearization effects are reported: G1aux causes under-compensation, while G3aux causes over-compensation. G2aux will provide proper level of compensation to achieve the best linearization effect.

Furthermore, an issue that appears when cascading two high-gain LC tanks could raise due to the mutual coupling between the two inductors. The mutual coupling enables a feedback path from the 2nd stage output to the 1st stage output. That adds a negative term to the input-output transfer function of the 1st stage. The feedback gain is directly proportional to the mutual coupling factor, the transconductance of the 2nd stage, and the impedance of the two tanks. If it is too high, the 1st stage frequency response gets distorted. In this work, an inductor isolation structure is proposed to minimize the feedback issue. A closed shape wall surrounds each inductor, and is formed by the stack of any of the metals and vias available for such a technology. The magnetic field of the outside inductor induces a current inside the wall with a direction such that to generate an opposite magnetic field. In that way the isolation of the inductor inside the wall increases. The metal conductivity, the wall width, and the distance to the inductor impact the isolation improvement.

Figure 17:
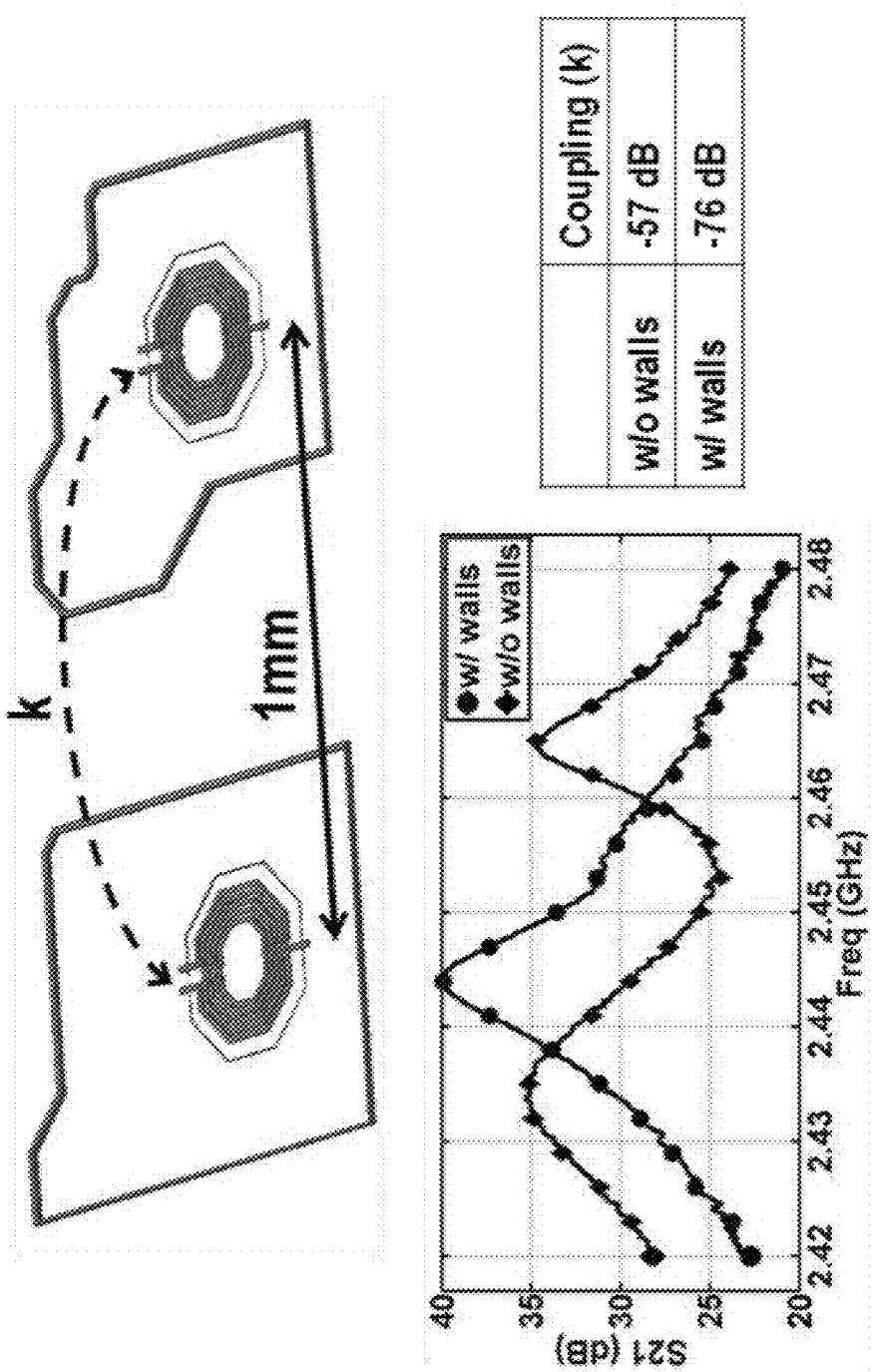
FIG. 17 is a 3D structure of inductors with isolation walls in accordance with some embodiments.

As shown in FIG. 17, the two inductors are placed 1mm from each other, and the design of the walls has been optimized through EM simulations. Two versions of the BPF have been fabricated. One with the walls as in FIG. 17, and one without the walls. EM simulations show a 19 dB improvement in the isolation (−57 dB with the walls, −76 dB without the walls).

FIG. 17 also shows the measured frequency response of the 1st stage with and without walls. The degradation of the response without walls supports the utility of the extra isolation. In some embodiments, the inductor is part of a band pass filter, which may also be a component of an amplifier, such as described herein. In. FIG. 17 each isolation wall encircles not only the inductor element, but also the relevant circuit, or substantial portions of the circuit in which the inductor is a component. In some embodiments, the wall may encompass tens of thousands or hundreds of thousands of components (transistors, capacitors, etc.). In this way, the wall is large enough to allow the desired electromagnetic field to develop around the inductor, while not wasting chip real estate. In some embodiments, the circuit portions included within the isolation wall are selected to minimize or reduce the number of signal, power, and bias lines that need to pass through the isolation wall. In some further embodiments, the wall may include wire bond pads such that power voltages and signal lines may also be provided to the circuit without requiring gaps in the isolation wall.

Figure 18:
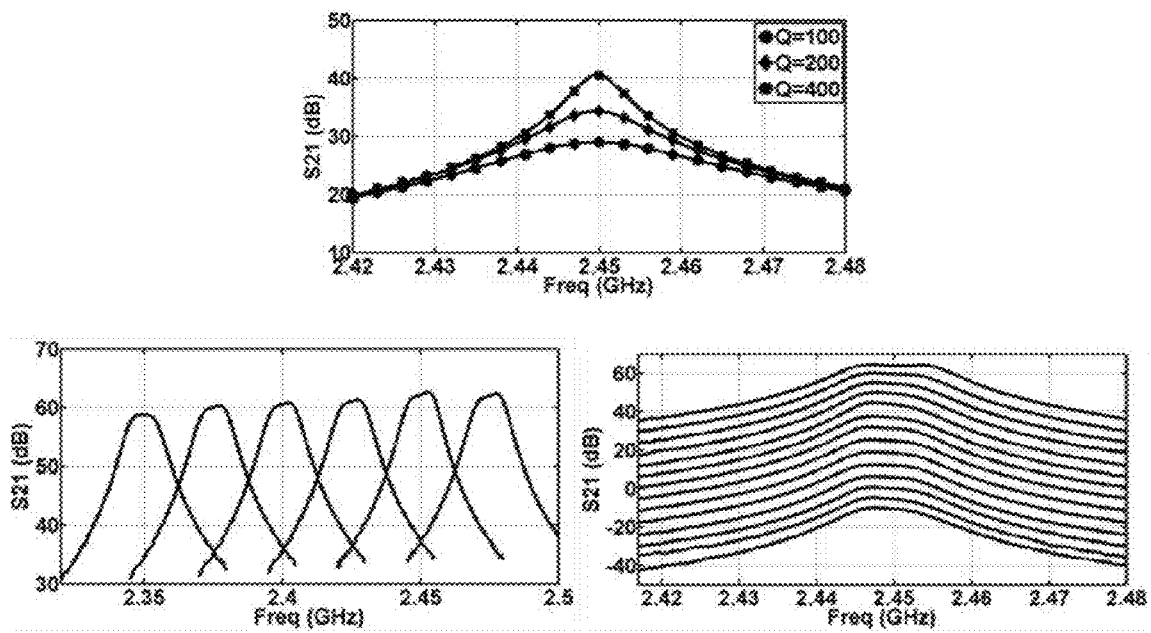
FIG. 18 are plots of measured filter responses in accordance with some embodiments.
Figure 21:
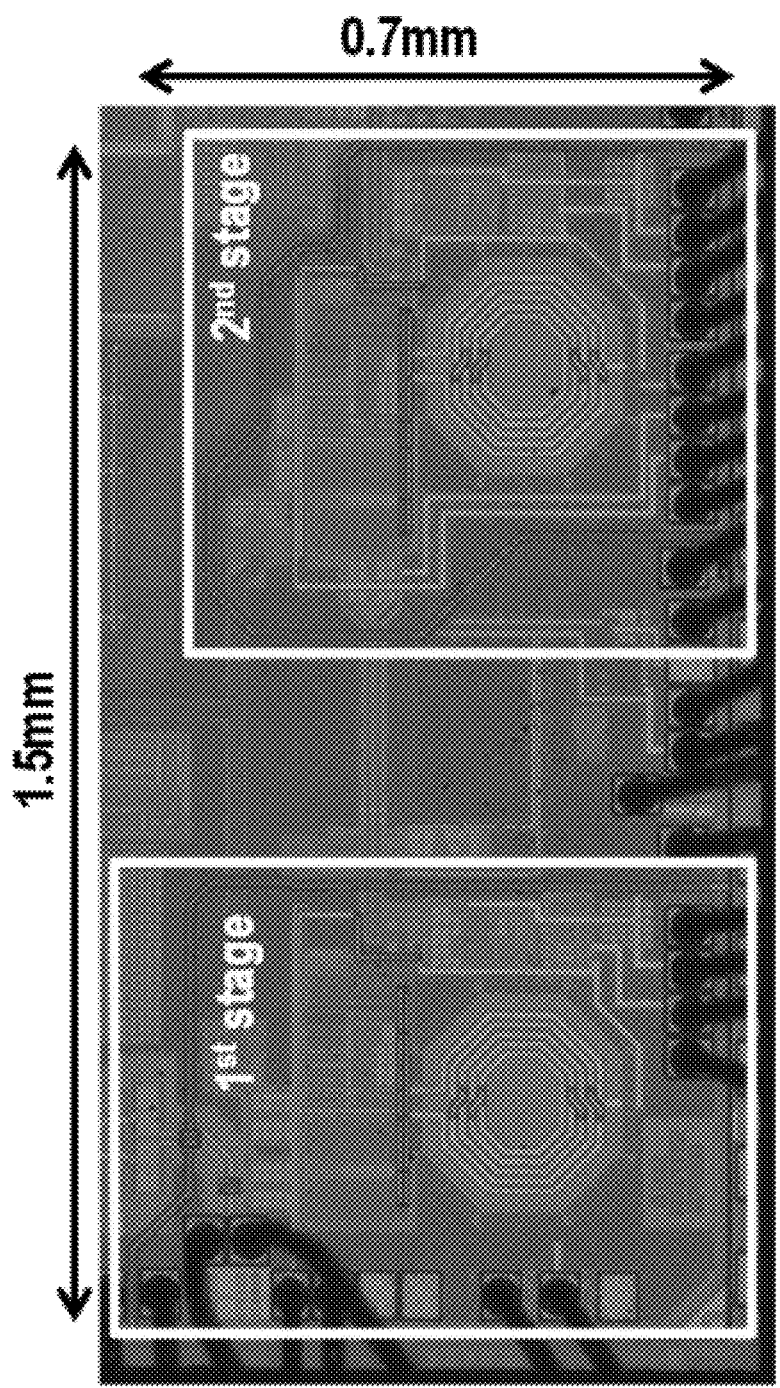
FIG. 21 is a die micrograph in accordance with some embodiments.

An example BPF is fabricated in 55 nm CMOS technology and draws 6 mA from a 1.3 voltage supply. The die micrograph is shown in FIG. 21. The measured filter response is showed in FIG. 18. When the Q of each stage is set to 400 and their center frequencies are staggered by approximately 8 MHz, an overall bandwidth of 12 MHz is obtained. The Q of each stage could be independently tuned much higher, but it is typically tuned to 400 to ensure robustness over PVT variations. The overall filter bandwidth could be changed by adjusting the position of the center frequencies. The filter covers a frequency range from 2.35 GHz to 2.48 GHz. The gain can be set between −10 dB and 62 dB by controlling the transconductance. FIG. 18 shows gain steps around 6 dB across the whole 72 dB gain tuning range. The measured NF is less than 9 dB.

Figure 19:
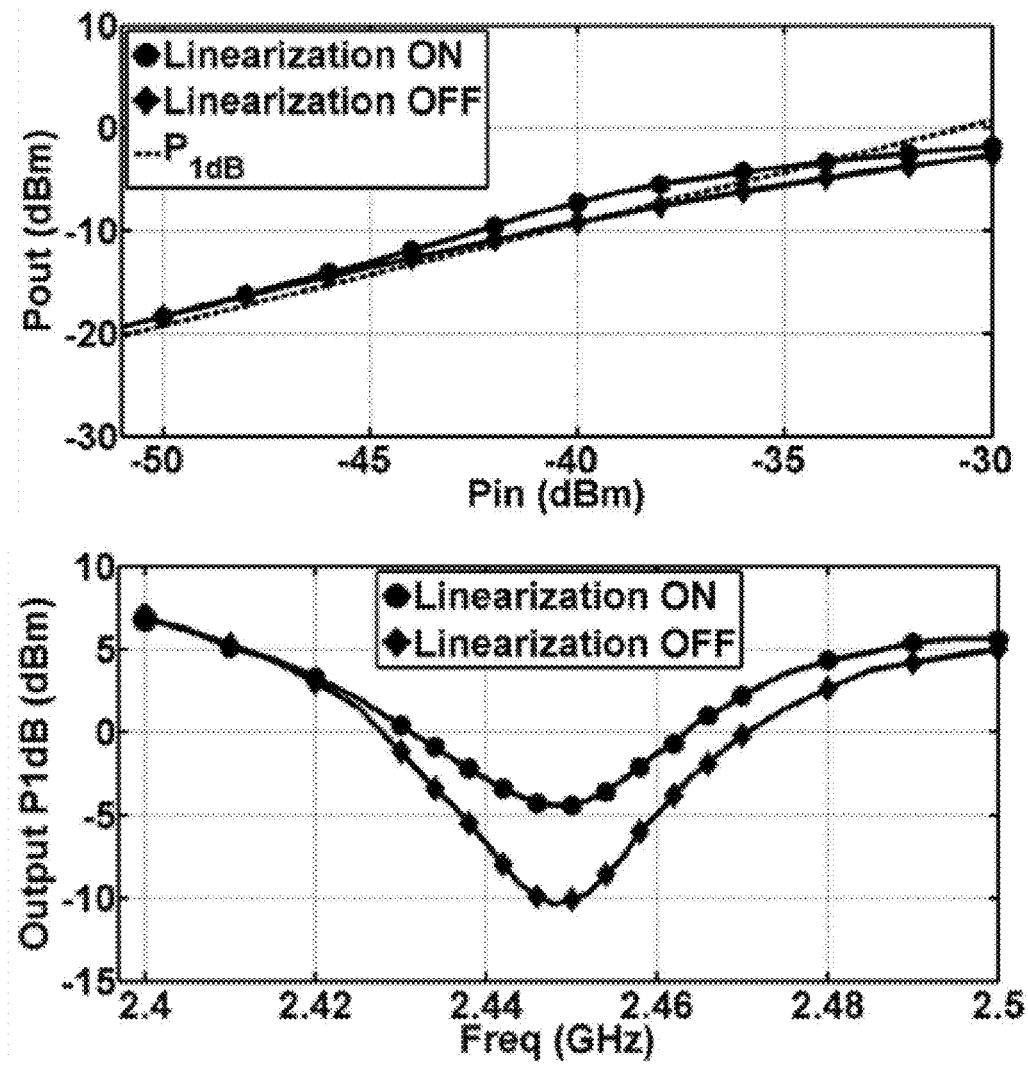
FIG. 19 are plots of a single stage of the LNA with and without linearization in accordance with some embodiments.

The P1$d$B of a single stage has been measured by turning ON and OFF the cross-coupled pair used for linearization. When the linearization block is OFF, the tank can achieve a maximum Q of 130. At that setting the linearization circuit improves the P1dB by 6 dB for in-band signals (see FIG. 19). The measured filter output P1dB is −4 dBm when the linearization circuit is ON and both the stages are tuned to Q=400. This data indicates that the proposed linearization technique facilitates the use of extremely high Q (~400), together with a high dynamic range performance (~100 dB).

The filter is compared to the state-of-the-art in the table of FIG. 20. It excels in terms of gain, bandwidth and usable quality factor. Two FIG.s-of-merit are listed for comparison. The first is a measure of frequency normalized DR over power consumption:

$$FoM = DR * \frac{BW}{Power}$$

$$FoM = P1dBout(\text{dBm}) - \text{Gain}(\text{dB}) + 174(\text{dBm}) - NF(\text{dB}) - 10\log(\text{Power}(\text{mW}))$$

The second takes also into account the filter Q:

$$FoM\_Q = DR * BW * \frac{Q}{Power}$$

$$FoM\_Q = FoM + 10\log\left(\frac{fc}{BW}\right)$$

The quality factor is a critical parameter for a BPF. Q summarizes the difficulty to obtain a small bandwidth at high carrier frequency. For at least this reason the second FoM is proposed. Both FoM show how this work outperforms thanks to the proposed linearization technique and the improved inductor isolation.

Figure 22:
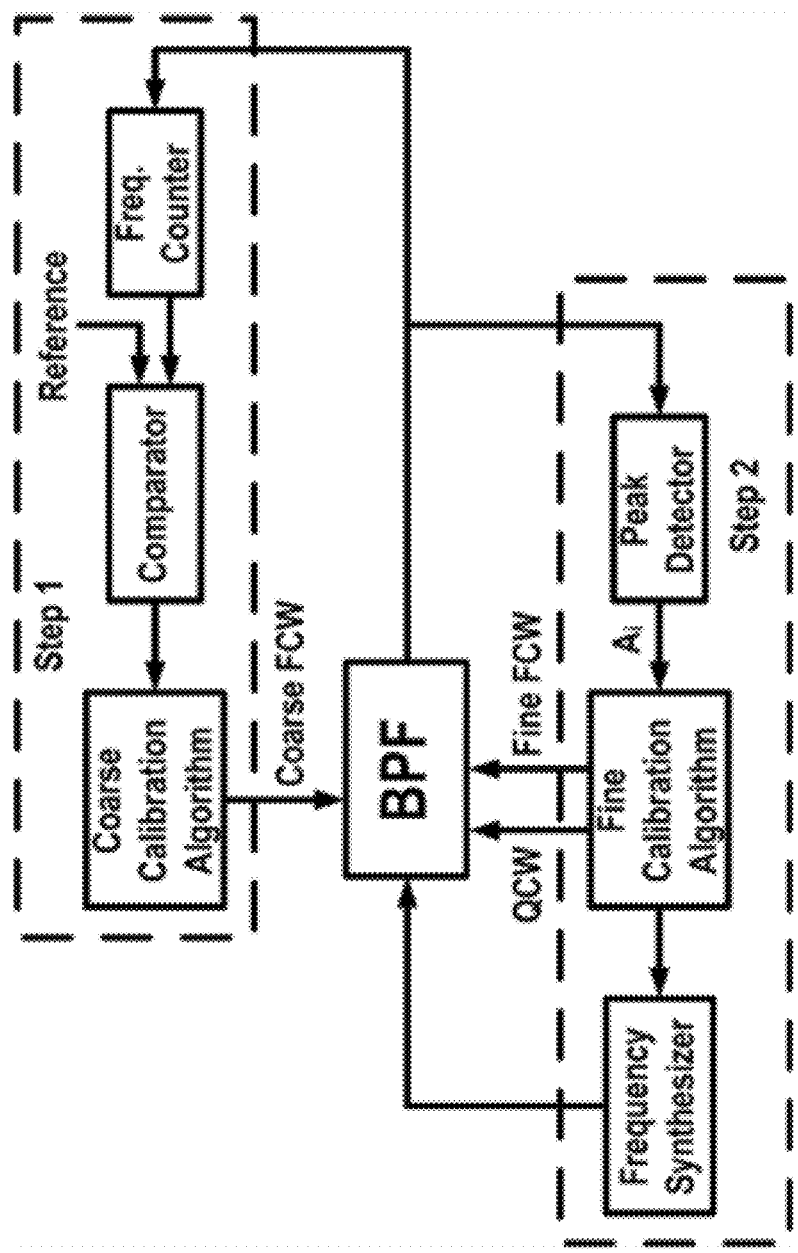
FIG. 22 is flow diagram of a calibration mechanism in accordance with some embodiments.

FIG. 22 is flow diagram of a calibration mechanism in accordance with some embodiments. FIG. 22 provides an overview of a two-step calibration scheme. In a first step coarse frequency calibration is performed. The tank circuit is made to oscillate and its frequency is counted and roughly tuned. At step two, fine frequency tuning and Q calibration are performed. Three consecutive tones are injected into the non-oscillating tank circuit and the frequency response is analyzed and tuned. The respective frequencies of the three tones are purposefully chosen to be the desired resonance and −6 dB frequencies.

Figure 23:
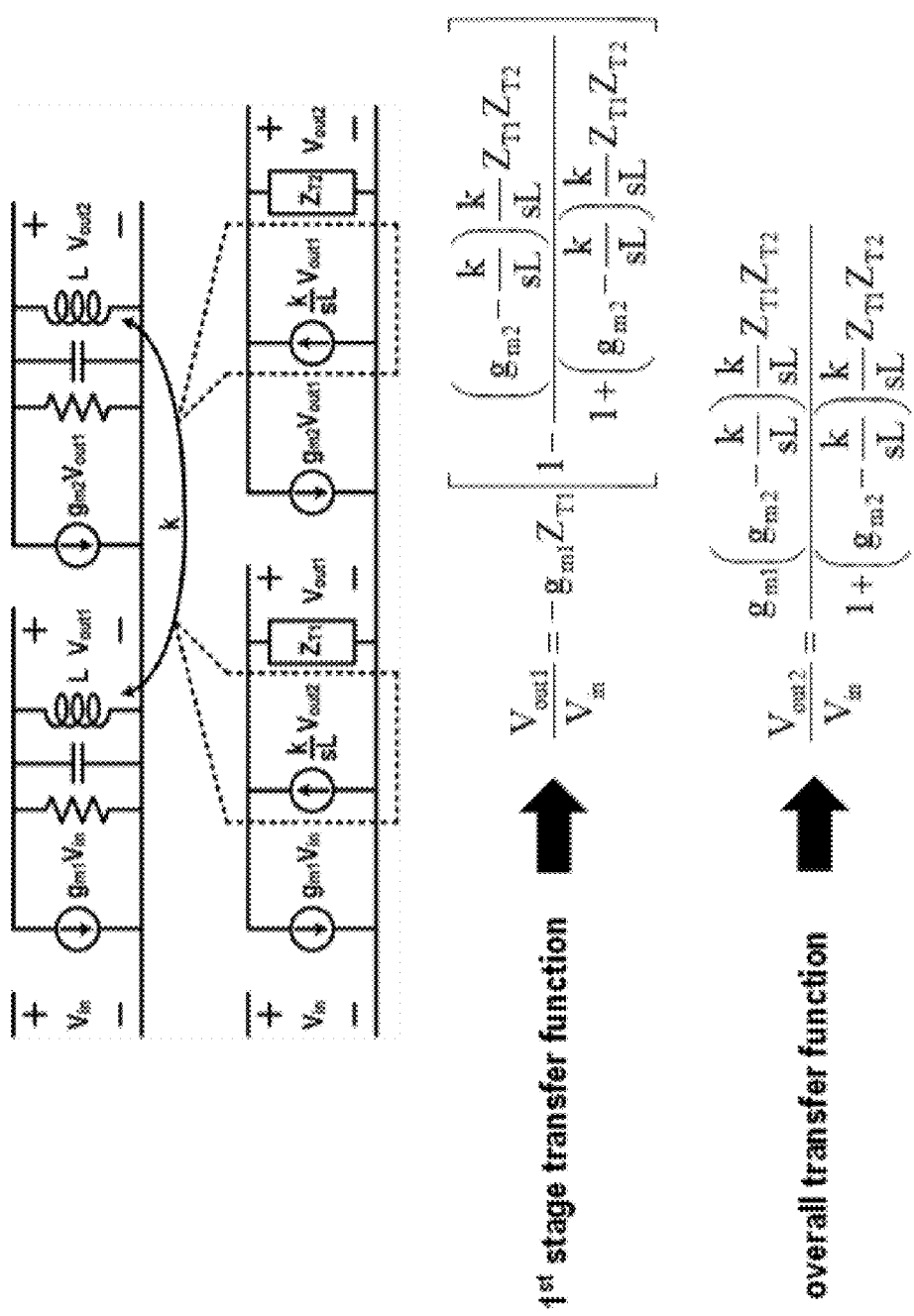
FIG. 23 is a diagram depicting transfer functions of a dual stage BPF with coupled inductors.

FIG. 23 is a diagram depicting transfer functions of a dual stage BPF with coupled inductors. In particular FIG. 23 depicts the first stage small signal transfer function as well as the overall small signal transfer function, including inductor mutual coupling.

In the foregoing specification, specific embodiments have been described. However, one of ordinary skill in the art appreciates that various modifications and changes can be made without departing from the scope of the invention as set forth in the claims below. Accordingly, the specification and FIG.s are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
   an integrated circuit device comprising at least two frequency selective circuits, where each frequency selective circuit comprises at least one inductor element; and
   a plurality of metallization walls, wherein each metallization wall encloses a respective inductor element of the at least one inductor element and reduces mutual coupling between the inductor elements of the at least two frequency selective circuits.

2. The apparatus of claim 1 wherein each metallization wall comprises a stack of vias.

3. The apparatus of claim 1 wherein each metallization wall encompasses respective circuit elements of the frequency selective circuits.

4. The apparatus of claim 1 wherein each metallization wall encompasses respective wire bond pads used to provide power to the frequency selective circuits.

5. The apparatus of claim 1 wherein each of the at least two frequency selective circuits comprise band pass filter circuits.

6. The apparatus of claim 5 wherein the band pass filter circuits are components in an amplifier circuit.

7. The apparatus of claim 1 wherein the at least two frequency selective circuits comprise two stages of a multi-stage amplifier circuit.

8. The apparatus of claim 1 wherein center frequencies of each of the at least two frequency selective circuits are staggered.

9. The apparatus of claim 1 wherein each of the at least two frequency selective circuits comprises a transconductance circuit followed by a tunable tank circuit.

10. The apparatus of claim 9 wherein the tunable tank circuits comprise respective capacitor banks, the integrated circuit further comprising a controller circuit that is configured to adjust the respective capacitor banks to alter the respective frequency responses of the at least two frequency selective circuits.

11. The apparatus of claim 9 wherein the transconductance circuit comprises a plurality of parallel connected transconductance cells.

12. The apparatus of claim 1 wherein each of the at least two frequency selective circuits comprises a linearization circuit that provides a respective auxiliary negative conductance.

13. The apparatus of claim 12 wherein each of the linearization circuits comprises a pseudo-differential cross-coupled pair of transistors biased in a sub-threshold region.

14. The apparatus of claim 13 further comprising a controller circuit configured to adjust a sub-threshold bias voltage of transistor pairs in the linearization circuit.

15. The apparatus of claim 1 further comprising a respective buffer circuit between each of the at least two frequency selective circuits.

16. A method comprising:
   adjusting the gain of a variable gain amplifier stage;
   adjusting a resonant frequency and a quality factor Q of a tunable bandpass filter connected as a load to the variable gain amplifier stage, wherein the bandpass filter includes an inductor that is surrounded by a metallization wall, a cross-coupled transistor pair, and at least one cross-coupled compensation transistor pair; and,
   biasing the at least one cross-coupled compensation transistor pair in a subthreshold region.

17. A method comprising:
   adjusting, to a first frequency, a resonant frequency of a first low noise amplifier stage having a first variable gain amplifier stage and a first tunable bandpass filter, wherein the first tunable bandpass filter comprises a first inductor surrounded by a first metallization wall;
   adjusting, to a second frequency offset from the first frequency, a resonant frequency of a second low noise amplifier stage having a second variable gain amplifier stage and a second tunable bandpass filter, wherein the second tunable bandpass filter comprises a second inductor surrounded by a second metallization wall; and
   biasing cross-coupled compensation transistor pairs in each of the first tunable bandpass filter and second tunable bandpass filter in a sub-threshold region to provide a compensation transconductance in the presence of large signals.

18. The method of claim 17 wherein the first frequency and second frequency are selected in accordance with a desired channel frequency.

19. The method of claim 17, further comprising adjusting a quality factor Q of the first and second bandpass filters to obtain a desired overall bandwidth and adjacent channel rejection ratio.

20. The method of claim 17 wherein each of the adjusting steps of the first and second bandpass filter resonant frequencies comprises:
   adjusting a bias point of the cross-coupled transistors to induce an oscillation in the respective bandpass filter;
   measuring the resonant frequency of the oscillation; and,
   adjusting the resonant frequency of the respective bandpass filter.

* * * * *